United States Patent

Uzoh

[11] Patent Number: 6,056,869
[45] Date of Patent: May 2, 2000

[54] WAFER EDGE DEPLATER FOR CHEMICAL MECHANICAL POLISHING OF SUBSTRATES

[75] Inventor: Cyprian Emeka Uzoh, Hopewell Junction, N.Y.

[73] Assignee: International Business Machines Corporation, Armonk, N.Y.

[21] Appl. No.: 09/090,736

[22] Filed: Jun. 4, 1998

[51] Int. Cl.[7] .................................................. C30B 30/02
[52] U.S. Cl. .......................... 205/771; 205/772; 205/717; 205/721; 205/660; 205/686; 204/212; 204/224 M
[58] Field of Search .................................. 205/771, 772, 205/717, 721, 660, 686; 204/212, 224 M

[56] References Cited

U.S. PATENT DOCUMENTS

| | | |
|---|---|---|
| 4,793,895 | 12/1988 | Kaanta et al. . |
| 4,821,466 | 4/1989 | Kato et al. . |
| 4,934,102 | 6/1990 | Leach et al. . |
| 5,078,801 | 1/1992 | Malik . |
| 5,096,550 | 3/1992 | Mayer et al. ............................ 205/642 |
| 5,183,972 | 2/1993 | Duane et al. . |
| 5,217,586 | 6/1993 | Datta et al. . |
| 5,219,787 | 6/1993 | Carey et al. . |
| 5,225,034 | 7/1993 | Yu et al. . |
| 5,240,552 | 8/1993 | Yu et al. . |
| 5,246,885 | 9/1993 | Braren et al. . |
| 5,256,274 | 10/1993 | Poris . |
| 5,262,354 | 11/1993 | Cote et al. . |
| 5,449,313 | 9/1995 | Kordonsky et al. . |
| 5,486,234 | 1/1996 | Contolini et al. . |
| 5,492,594 | 2/1996 | Burke et al. . |
| 5,534,106 | 7/1996 | Cote et al. . |
| 5,543,032 | 8/1996 | Datta et al. . |
| 5,567,300 | 10/1996 | Datta et al. . |
| 5,575,706 | 11/1996 | Tsai et al. . |
| 5,585,673 | 12/1996 | Joshi et al. . |

*Primary Examiner*—Arun S. Phasge
*Attorney, Agent, or Firm*—Pollock, Vande Sande & Amernick

[57] ABSTRACT

A device for electrochemically deplating metal from side edges and a backside of a semiconductor wafer or substrate. The device includes a shaped cathode having a shape substantially corresponding to a shape of at least a portion of the semiconductor wafer, such that the shaped cathode at least partially covers the backside and at least partially covers the side edges of the semiconductor wafer. The position of at least one of the semiconductor wafer and the shaped cathode is altered by position altering apparatus during the electrochemical deplating.

28 Claims, 6 Drawing Sheets

WAFER EDGE DEPLATER FOR CHEMICAL MECHANICAL POLISHING OF SUBSTRATES

FIELD OF THE INVENTION

The present invention relates to a method and apparatus for the selective removal of metal from surfaces of a substrate after the substrate has been subjected to a metal deposition operation. More particularly, the present invention relates to a method and apparatus to remove metal from surfaces where the presence of such metal is undesirable.

BACKGROUND OF THE INVENTION

In the production of microelectronic devices, one or more metals and/or alloys may be deposited on a substrate for a variety of purposes. Typically, it is desirable for metal to be deposited only in certain locations and not in others. Metal deposited outside of desired locations may not only lead to defects in semiconductor devices, but may also cause contamination of apparatus utilized during and/or after plating. Additionally, material deposited on areas where it is not meant to be deposited may not adhere properly. For example, copper has poor adhesion to most insulators.

As a result, copper deposited at the edge or backside or other areas of a wafer or substrate may flake off of the substrate, contaminating the deposition equipment and/or other subsequent apparatus and equipment that are exposed to the wafer or substrate. Particulate contamination of devices may result in degraded chip yield loss, performance, and expensive equipment clean-up operations. Also, expensive operating protocols may then be established to minimize or reduce particulate problems.

Operations that have been utilized to remove metal deposited at desired locations include specialized backside spray tools and/or edge grinding at edge stations. A common method to help prevent unwanted metal deposition at edges of wafers includes the use of a clamp ring or shadow ring utilized during metal sputtering or CVD deposition. FIGS. 1a, 1b, 1c, and 1d illustrate an example of such a device. However, such mechanical contraptions are expensive. Other cleaning methods utilize an inert gas curtain to prevent metal deposition near the edge, rim, or backside of wafers.

Additionally, utilizing a clamp ring or shadow ring still generates particulates, because metal deposition on such rings flakes off as well. Furthermore, clamp rings and shadow rings need to be maintained.

Clamp and shadow rings operate by excluding a portion of the wafer edge. For example, a clamp or shadow ring could exclude about 2 to about 5 mm of a wafer edge. Such exclusion reduces the surface area available for forming chips. As a result, the number of chips produced from a wafer may be reduced when utilizing a clamp ring or shadow ring. A clamp ring or shadow ring may also affect the uniformity and the profile of the deposit.

Also, straggling metal is occasionally deposited on the surface of wafers, at regions under the clamp ring. These spurious deposits may stick poorly to the underside of the clamp ring. As these deposits accumulate, the clamp ring may become an additional source of defects and/or a particle generator, contaminating different wafers. When the clamp ring underside deposit becomes sufficiently thick, the clamp ring may lose its effectiveness.

An additional problem related to unwanted metal deposition is tool cross-contamination and line contamination. These problems may be caused by improperly deposited metal on a substrate randomly falling off to surfaces where they are least desired to be. An example of such an undesirable surface includes a surface on a robot handler.

SUMMARY OF THE INVENTION

The present invention resolves the above and other problems by providing a device for electrochemically deplating metal from side edges and a back side of a semiconductor wafer. The device includes using a shaped cathode to remove undesired metal at the backside and side edges of semiconductor substrates and/or wafers. The device also includes means for altering a position of metals at least on a semiconductor substrate and/or wafer.

Additional aspects of the present invention provide a method for electrochemically deplating metal from side edges and a backside of a semiconductor wafer. The method includes placing a shaped cathode such that the shaped cathode at least partially covers the backside and side edge of the semiconductor wafer in the vicinity of at least a portion of the backside and side edges of the semiconductor wafer. The wafer is rendered anode with respect to the shaped cathode during the deplating operation. Also, the wafer or shaped cathode may be rotated with respect to one another during the deplating step. Current is supplied to the anode and cathode for a time sufficient to substantially completely deplate metal deposited on the side edges and backside of the semiconductor wafer.

According to further aspects of the present invention, a metal etchant is utilized to remove undesired metals, while at least a portion of the wafer, such as at least a portion of the upper side of the wafer, is protected by a jacket of water. The deplater may be in the form of a stand alone apparatus. Alternatively, the deplater may be incorporated or integrated into equipment such as a chemical-mechanical polisher.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned aspects of the present invention will be more clearly understood when considered in conjunction with the accompanying drawings, in which.

DETAILED DESCRIPTION OF THE INVENTION

As stated above, metal deposition at the edges, rim, and/or backside of semiconductor wafers and/or substrates is problematic in the management of chip manufacturing processes and apparatus. Metal deposition at unwanted locations is particularly troublesome in the case of copper damascene processes. In one example, after copper and barrier polish, because of poor adhesion of copper to most insulators, cooper flakes or particles may separate from edges and/or the backside of a wafer. Such copper particulates are a major concern for tool contamination and tool-to-tool cross-contamination.

Figure 1A:
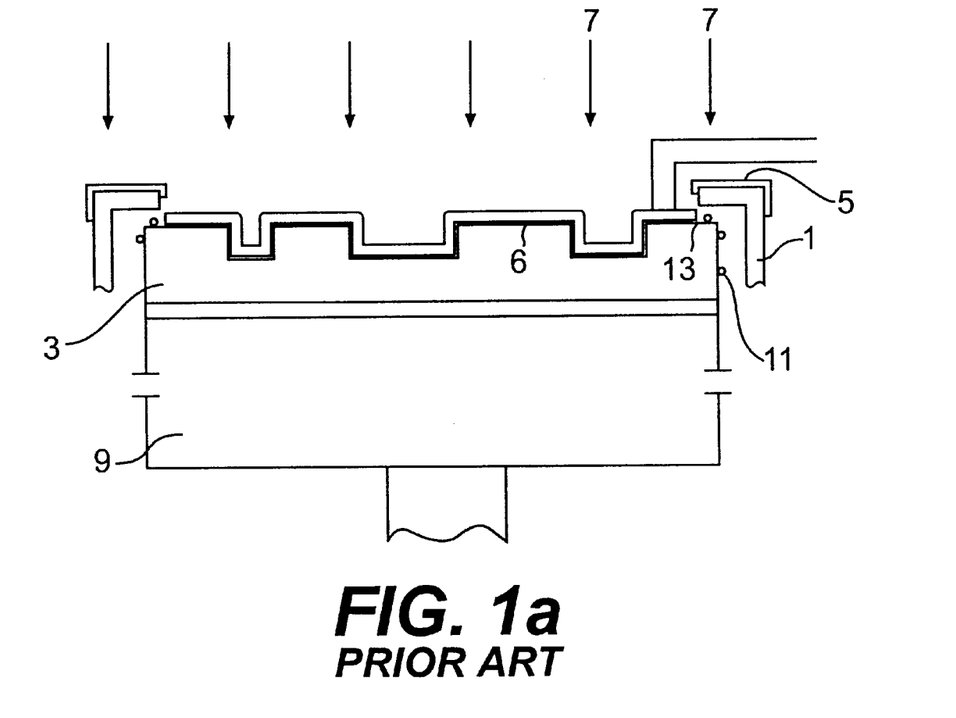
FIG. 1a represents a cross-sectional view of a prior art apparatus that utilizes a clamp ring to prevent metal deposition on the edge and backside of a wafer illustrating a relative position of the clamp ring with respect to a wafer.

To prevent metal deposition on edges of wafers, the edges of the wafers may be protected with a clamp ring or shadow ring during metal sputtering or chemical vapor deposition processes. FIG. 1a illustrates a cross-sectional view of an embodiment of a clamp ring 1. Clamp ring 1 is illustrated adjacent a wafer 3 on which a metal seedlayer 5 is being deposited on an adhesion layer 6. Depositing metal is indicated by arrows 7. Wafer 3 is arranged on a deposition stage 9.

Although such clamp rings or shadow rings may work, over time, clamp rings and shadow rings themselves may become sources of particles. This is a result of a variety of reasons. For example, stresses of thick metal deposits on the rings may generate particles. Also, straggling copper films may be deposited under the ring because of the penumbra effect. FIG. 1a illustrates undesirable metal deposition 11 under the clamp ring. The seedlayer 5 is also deposited on the clamp ring 1.

Figure 1B:
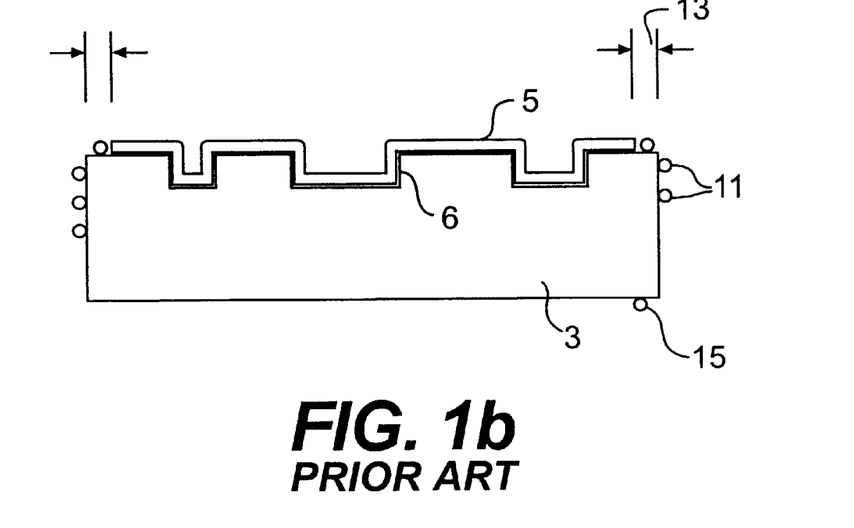
FIG. 1b represents a cross-sectional view of the wafer illustrated in FIG. 1a after seedlayer deposition, showing edge exclusion and undesirable seed layer at the edge and backside of the wafer.

Clamp rings and shadow rings also have other problems associated with their use. For example, a portion of the wafer or substrate 3 is covered or shadowed by the clamp ring 1. This portion typically is referred to as an exclusion zone 13. FIG. 1b also illustrates the edge exclusion zone 13 and unwanted metal deposition 11 and 15 on the wafer edge and backside, respectively.

Additionally, when carrying out electroplating utilizing a clamp ring, contact pins typically need to reach further beyond the exclusion zone(s) to make electrical contact. In another case, for copper CVD films, a special backside gas flow configuration may be required to prevent copper deposition on the backside of wafers.

Figure 1C:
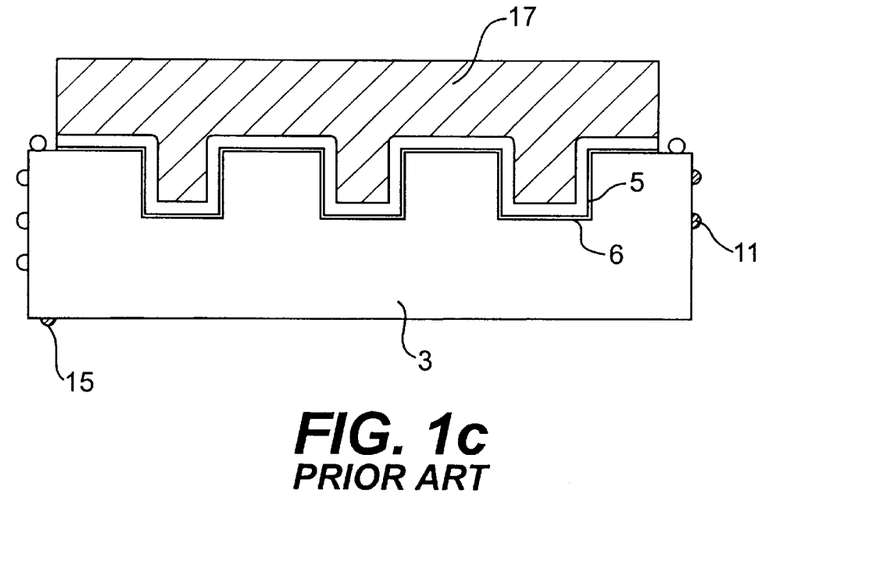
FIG. 1c represents a cross-sectional view of the wafer illustrated in FIGS. 1a and 1b after filling of patterned lines and vias.
Figure 1D:
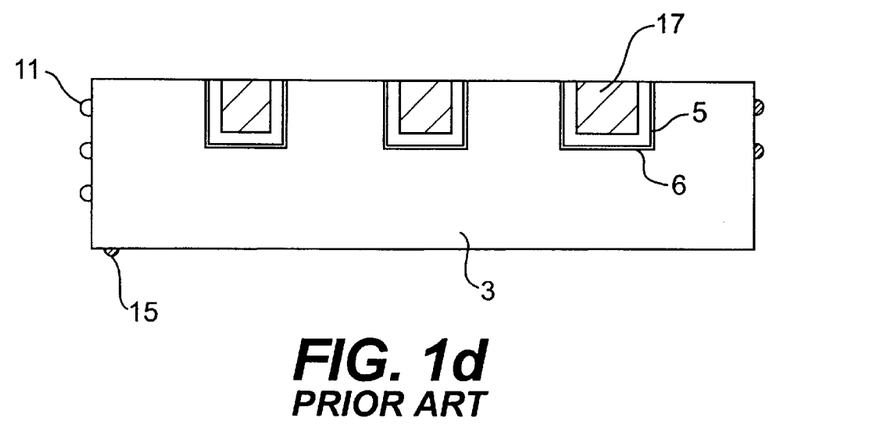
FIG. 1d represents a cross-sectional view of the wafer illustrated in FIGS. 1a, 1b, and 1c after carrying out chemical-mechanical polishing to isolate metal features, also showing unwanted metals not removed by chemical-mechanical polishing methods.

FIG. 1c represents a cross-sectional view of the wafer illustrated in FIGS. 1a and 1b after patterned lines and vias are completely filled 17. After filling of patterned lines and vias, the wafer may be subjected to chemical-mechanical polishing to isolate metal features. FIG. 1d illustrates the results of the chemical-mechanical polishing. As shown in FIG. 1d, the chemical-mechanical polishing does not remove unwanted metals 11 and 15.

Figure 2A:
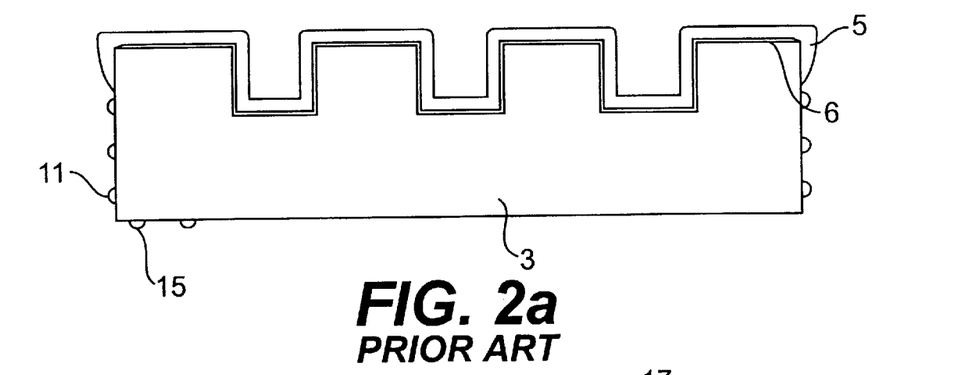
FIG. 2a represents a cross-sectional view of clampless barrier and seedlayer deposition of metal on a wafer before trench and via fill.
Figure 2B:
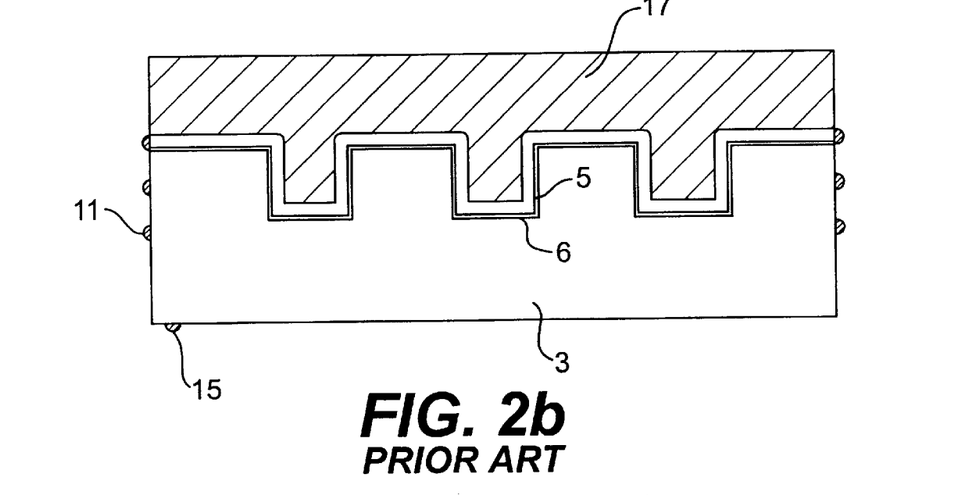
FIG. 2b represents a cross-sectional view of the wafer illustrated in FIG. 2a after trench and via fill, showing wafer edges with discontinuous unwanted metal.
Figure 2C:
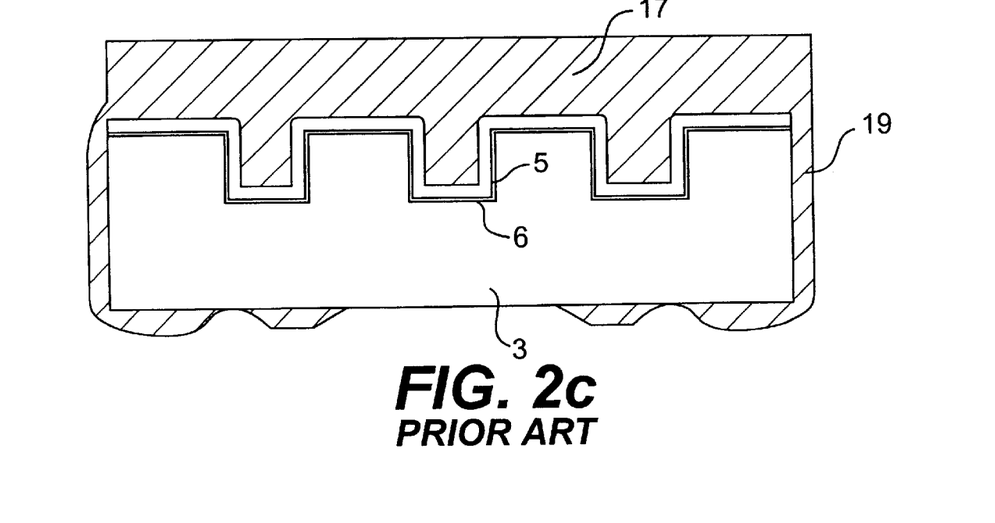
FIG. 2c represents a cross-sectional view of the wafer illustrated in FIG. 2a after trench and via fill, showing wafer edges with continuous unwanted metal.

FIGS. 2a, 2b, and 2c illustrate clampless barrier and seedlayer deposition of metal on a wafer. In particular, FIG. 2a illustrates seedlayer 5 deposition of metal on an adhesion layer 6 on a wafer 3 before trench and via fill. After trench and via fill, as illustrated in FIG. 2b, unwanted metal may remain on the side edge 11 and backside 15 of the wafer in discontinuous deposits. On the other hand, the unwanted metal deposits on the side edge and backside may be continuous 19 after trench and via fill, as illustrated in FIG. 2c.

The present invention eliminates the need for clamp rings or shadow rings during metal deposition, particularly during metal sputtering or CVD deposition. The present invention results in better uniformity of deposited metal than is experienced when utilizing a clamp ring or shadow ring. The present invention also permits higher die design and yield on a wafer as a result of eliminating the clamp ring.

The present invention includes a small, compact, high-speed wafer edge and backside metal deplater. The present invention can be incorporated into a chemical-mechanical polishing (CMP) tool as a pre-CMP step. A device according to the present invention includes at least one shaped cathode 21, 23, or 25, as shown in FIGS. 3a, 3b, and 3d, respectively.

Figure 3A:
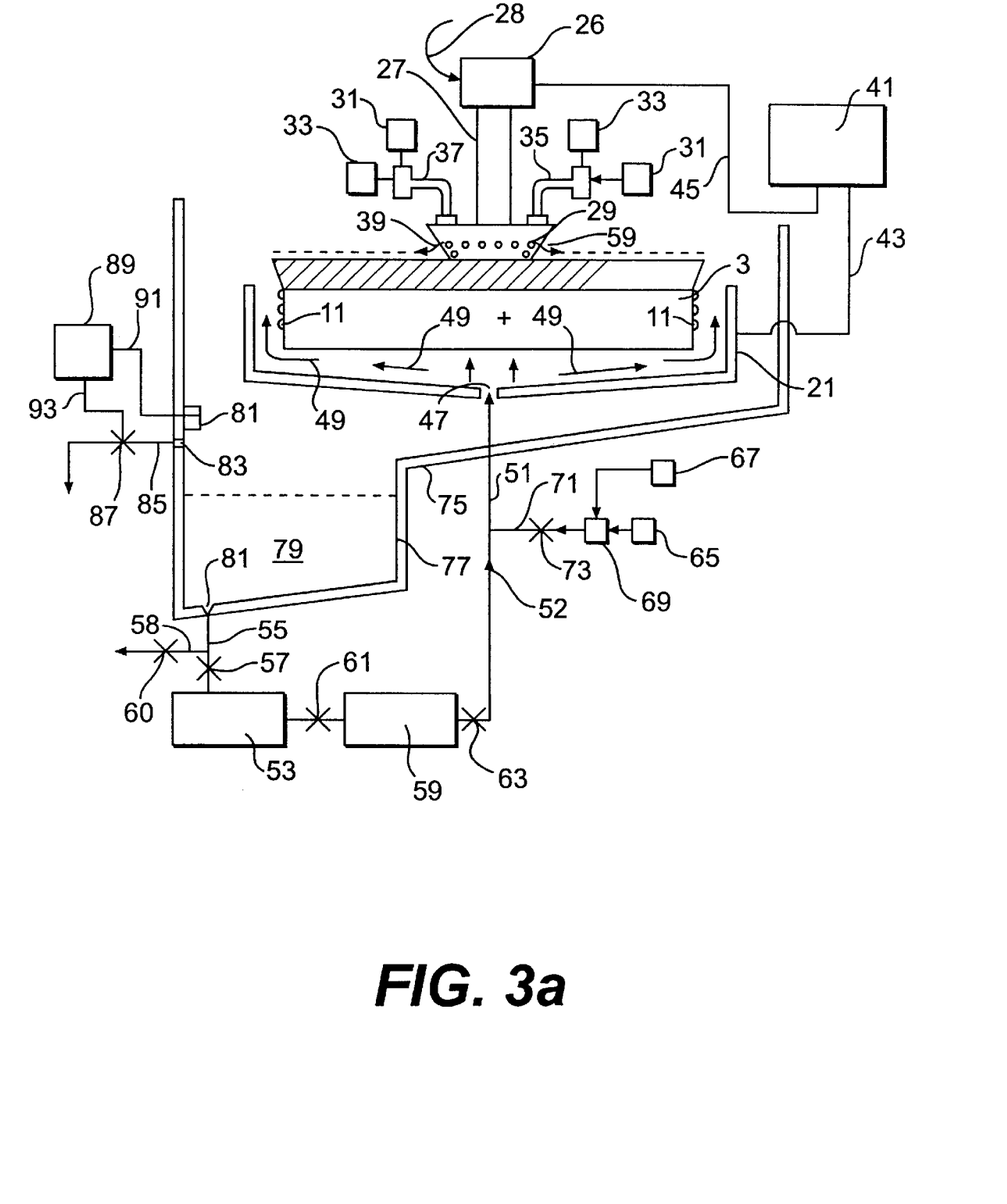
FIG. 3a represents a cross-sectional view of an embodiment of a substrate deplater according to the present invention, including a shallow bowl-shaped cathode.
Figure 3B:
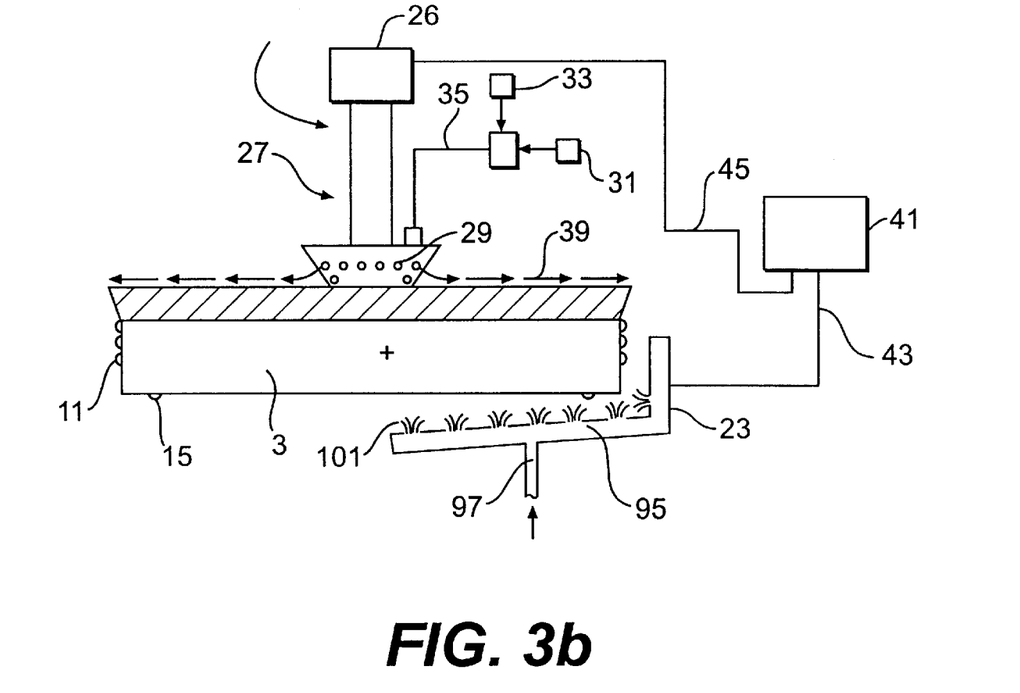
FIG. 3b represents a cross-sectional view of another embodiment of a substrate deplater according to the present invention, including a shaped bar or tube cathode.
Figure 3C:
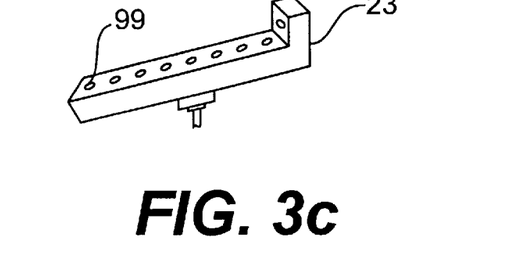
FIG. 3c represents a perspective view of the shaped cathode of the embodiment illustrated in FIG. 3b.
Figure 3D:
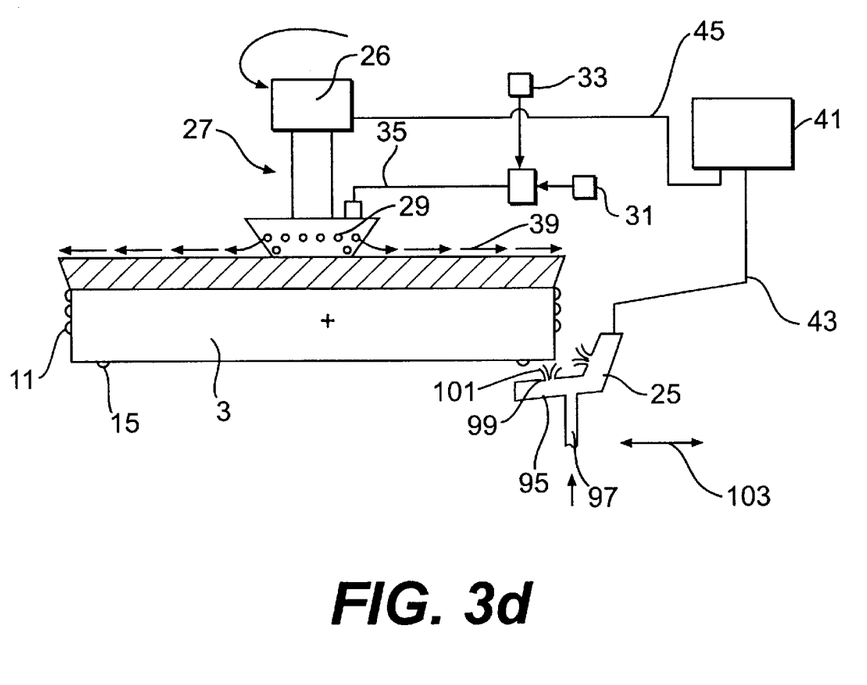
FIG. 3d represents a cross-sectional view of a further embodiment of a substrate deplater according to the present invention, including a short shaped cathode that may slide laterally closer to or away from the wafer edge.

As illustrated in FIGS. 3a, 3b, and 3d, the wafer 3 may be arranged within the shaped cathode. The present invention also includes means for altering a position of the semiconductor wafer and/or the shaped cathode during the electrochemical deplating processing utilizing the shaped cathode.

The position of the semiconductor wafer and/or the shaped cathode may be altered by rotating the semiconductor wafer and/or the shaped cathode. Alternatively, or, additionally, the semiconductor wafer and/or the shaped cathode may be slid, or moved in a non-rotating manner. Sliding movements typically take place along the rotational axis of the shaped cathode or the workpiece. The shaped cathode and/or the semiconductor wafer may be slid laterally or vertically.

Regardless of the type of movements of the shaped cathode and/or the workpiece, the means for altering a position of the shaped cathode and/or semiconductor wafer could include any typically known means. For example, the semiconductor wafer could be engaged by vacuum source and the vacuum source moved up and down or rotated to alter the position of the semiconductor wafer relative to the shaped cathode.

The shaped cathode may include a single, unitary, continuous member. Alternatively, the shaped cathode may include one or more sections that may or may not be joined to each other. A shaped cathode according to the present invention may entirely surround the backside and side edge of a semiconductor wafer or only partially surround the wafer. By surround, it is meant that the shaped cathode may have an area equivalent to only a small portion of the wafer or substrate, such as much less than 50%.

To properly position a semiconductor wafer within the shaped cathode, the present invention may include at least one edge metal sensor for sensing metal deposited on at least one of the backside and side edges of a semiconductor wafer. The shaped cathode may also include discontinuous sections or segmented such that only a portion of the cathode area is available for metal removal. For example, only about 2% to about 8% of the cathode area may be available for metal deposition. The remaining cathode area may be protected with a polymer coating, such as PVDF or polypropylene.

The present invention may also include an anode or source of positive voltage that may be interconnected with the front side of the semiconductor wafer.

The altering of the position of the semiconductor wafer and/or the shaped cathode may take place continuously over one period of time. Alternatively, the position altering may take place over a number of time periods. The duration of one or multiple periods may also vary.

Additionally, the rate of movement of the semiconductor wafer and/or the shaped cathode may be altered during the position altering. Furthermore, at times, either one or both of the semiconductor wafer and shaped cathode may be moved. Still further, the position altering may vary between sliding and rotating movements of the shaped cathode and/or the semiconductor wafer.

If the semiconductor wafer or the shaped cathode is rotated, the rotation rate may be from about 10 to about 40 revolutions per minute. Typically, all or substantially all of the metal deposited on the edges and backside of a wafer can be removed in less than about 20 sec.

After deplating metal from the edges and backside of a wafer, the wafer may be polished. Alternatively, the wafer may be patterned with photoresist for subsequent processing. Polished wafers may be coated with dielectric.

FIG. 3a illustrates an example of a system that incorporates a shaped cathode according to the present invention. The system represented in FIG. 3a is carrying out edge and backside deplating. The shaped cathode illustrated in FIG. 3a is a shallow bowl-shaped shaped cathode.

The wafer or substrate 3 and/or shaped cathode may be arranged to be in close proximity for treatment. According to one embodiment, the wafer or substrate may be lowered toward the shaped cathode. During treatment to remove unwanted metal, the distance between the shaped cathode and the wafer or substrate may vary. According to one embodiment, the wafer or substrate may be separated from the shaped cathode by a distance of from about 1 mm to about 3 mm.

As shown in FIG. 3a, a system according to the present invention may include a vacuum chuck 27 for engaging the wafer or substrate 3. The vacuum chuck 27 may be utilized as a means for altering the position of the wafer 3 relative to the shaped cathode. Accordingly, the vacuum chuck may be connected to a motor or other rotation means 26. Rotation of the vacuum chuck is represented by arrow 28.

The vacuum chuck 27 may include various outlets 29 for directing materials toward the substrate. For example, as illustrated in FIG. 3a, the vacuum chuck outlets 29 for directing deionized water and/or nitrogen ($N_2$) toward the wafer during deplating. Other materials may alternatively or additionally be directed at the wafer or substrate being treated. Nitrogen, deionized water, and/or other material may be supplied to the vacuum chuck 27 from sources 31 and 33, respectively. The nitrogen, deionized water, and/or other material, may flow from sources through conduits 35 and 37 into vacuum chuck 27. The flow of nitrogen, deionized water, and/or other material may be directed by spray heads arranged in outlets 29 in the vacuum chuck. Flow of nitrogen, deionized water, and/or other material is indicated by arrows 39.

The material directed at the top of the wafer or substrate may depend upon the desired function of the material. For example, nitrogen and/or deionized water may protect the wafer or substrate from spray exhaust or electrolyte emanating from the backside of the wafer.

As FIG. 3a illustrates, a system according to the present invention may include a power supply 41 for supplying power to the shaped cathode and/or a motor for altering the position of the wafer or substrate and/or the shaped cathode. Motor 41 may be connected to the shaped cathode and/or one or more motors by lines 43 and 45.

One or more electrolytes and/or etchants may be directed into the space between the wafer 3 and the shaped cathode 21. Accordingly, a system according to the present invention may include means for supplying electrolyte to this space. For example, in the embodiment illustrated in FIG. 3a, the shaped cathode may include at least one port 47 for supplying at least one electrolyte into the space between the wafer and the shaped cathode. Flow of electrolyte is indicated by arrows 49.

The composition of the electrolyte may vary, depending upon the application. According to one example, the electrolyte includes from about 5% to about 20% by volume sulfuric acid. The electrolyte may also include from about 1% to about 5% ammonium persulfate. Of course, those skilled in the art could determine an effective composition of the electrolyte for removing a particular metal or metals from the wafer or substrate.

Electrolyte may be supplied to port 47 through conduit 51. Electrolyte may be supplied to conduit 51 from an electrolyte source. Flow of electrolyte through conduit 51 is indicated by arrow 52. The electrolyte source could be separate from the system. Alternatively, as in the embodiment illustrated in FIG. 3a, the electrolyte could be supplied to port 47 from a reservoir that electrolyte drains into after flowing between the wafer and the shaped cathode.

Regardless of the source, electrolyte may be pumped through conduit 51 and port 47 by pump 53. Pump may be connected to a power supply and a controller (not shown). Pump 53 may be connected to the supply of electrolyte by conduit 55. A valve 57 may be arranged in conduit 55 to control flow of electrolyte. Additionally, a conduit 58 may be arranged upstream of pump to permit electrolyte to be directed to a drain. A valve 60 may control flow of electrolyte from conduit 55 through conduit 58 to drain.

One or more filters 59 may be arranged in the conduit 51 between the pump 53 and the port 47 to control electrolyte quality. Valves 61 and 63 may be arranged upstream and/or downstream of filter 59 to control flow of electrolyte.

To enrich the electrolyte, or copper stripping solution, one or more materials may be introduced into the electrolyte prior to delivery of the electrolyte into the space between the wafer or substrate and the shaped cathode. Such materials may include oxygen ($O_2$) and/or nitrogen ($N_2$). For example, the system illustrated in FIG. 3a may include a source of oxygen 65 and a source of nitrogen 67 for introducing oxygen and/or nitrogen into conduit 51.

Nitrogen source 67, oxygen source 65, and/or any other enriching or other material may be connected to conduit 51 for introducing the material into the electrolyte. For example, the embodiment illustrated in FIG. 3a includes at least one injector 69 for injecting the oxygen, nitrogen, or other material into conduit 51. Each material could have its own associated injector. Injector(s) 69 may be connected to conduit 51 with conduit 71. Along these lines, an embodiment that includes a plurality of injectors may include a conduit to connect each injector to conduit 51. A valve 73 may be arranged between injector(s) 69 and conduit 51 for controlling flow of material from material sources 65 and 67 into conduit 51.

In an embodiment in which oxygen is introduced into conduit 51, oxygen may be introduced at a rate of from about 50 to about 300 sccm/L of electrolyte solution.

To contain electrolyte, deionized water, and/or other treatment materials involved in a deplating operation, a system according to the present invention may include an electrolyte drain pan 75. Drain pan 75 may at least partially or entirely surround portions of the vacuum chuck, wafer, and/or shaped cathode. Drain pan 75 may include an electrolyte reservoir portion 77 at a low point for electrolyte solution 79 to gather in.

Reservoir 77 may act as a supply of at least a portion of electrolyte solution supplied to the space between the wafer or substrate and shaped cathode. Accordingly, reservoir may include a drain 81. Drain may be connected to conduit 55. Electrolyte or a portion of electrolyte draining into reservoir 77 may also be discarded.

To control the level of electrolyte in the drain pan, the system according to the present invention may include a level sensor 81. Drain pan may include a drain 83 to drain electrolyte from the drain pan if the fluid reaches a level deemed unacceptable. Drain 83 may be connected to a drain conduit 85. Flow of electrolyte from drain 83 through conduit 85 may be controlled by valve 87.

Controller 89 may be connected to sensor 81 by line 91. Controller 89 may receive signals produced by sensor 81 indicating the level of the electrolyte. Controller 89 may also be connected by line 93 to valve 87 to control opening and closing of the valve to control draining of electrolyte from drain pan 75.

FIG. 3b illustrates an alternative embodiment of the present invention. The embodiment of the invention illustrated in FIG. 3b includes a shaped bar or tube cathode 23. Other than the shape and operation of the shaped cathode itself, the embodiment shown in FIG. 3b is substantially similar to the embodiment shown in FIG. 3a. Therefore, the above discussion regarding the system applies to the embodiment shown in FIG. 3b as well. Rather than surround a portion of the wafer or substrate as in the embodiment illustrated in FIG. 3a, the shaped cathode depicted in FIG. 3b extends along a portion of the wafer.

FIG. 3c provides a better understanding of the shape of the shaped cathode 23 represented in FIG. 3b by providing a perspective view of the shaped cathode. As portrayed in FIGS. 3b and 3c, shaped cathode is L-shaped. The longer portion of the L-shape extends along a portion of the backside of the wafer or substrate 3. Typically, the longer arm of the L-shape is at least as long as the one-half of the width of the wafer or substrate, or radius in the case of a round wafer or substrate, as shown in FIG. 3b. An arm with this length will help to ensure that all of the backside is treated. The long arm of the L-shape could be shorter if, for example, nozzle(s) in the arm can direct flow to all of the backside of the wafer or substrate. the nozzle(s) are described below in greater detail.

The shorter arm of the L-shape typically extends from the long arm as shown in FIG. 3b to as to extend at least partially up the side of the wafer or substrate. The length of both arms and number and arrangement of nozzles typically is sufficient to result in treatment of the entire backside and side edges of the wafer or substrate.

As shown in FIG. 3b, the shaped cathode may includes an internal passage through which electrolyte and/or etchant may flow. Although the embodiment depicted in FIG. 3b is shown to include such an internal passage, any embodiment, including the embodiment illustrated in FIG. 3a could include such an internal passage. The internal passage 95 may be connected to an electrolyte supply conduit similar to conduit 51 illustrated in FIG. 3a. The other details regarding the electrolyte supply, pump(s), valve(s), filter(s), enriching material(s), and other aspects of the system are discussed in detail above.

To direct electrolyte toward the wafer of substrate, the shaped cathode may include at least one opening. the shaped cathode shown in FIGS. 3b and 3c includes a plurality of openings 99. To help control the flow of electrolyte, the shaped cathode may include a nozzle arranged in each opening 99. FIG. 3b illustrates the flow 101 of electrolyte from the openings/nozzles. The number and arrangement of nozzles and flow therefrom may be designed so as to be sufficient to treat all surface of the wafer or substrate that it is desired to treat and with the desired effectiveness.

FIG. 3d illustrates another embodiment of the shaped cathode. The embodiment shown in FIG. 3d is similar to the embodiment shown in FIGS. 3b and 3c with the exception that the long arm of the L-shape is shorter in the embodiment shown in FIG. 3d. The embodiment of the shaped cathode shown in FIG. 3d is similar to the embodiment shown in FIGS. 3b and 3c in most other respects and so reference is made to the above discussion regarding the embodiment depicted in FIGS. 3b and 3c.

On difference between the two embodiments is that the position of the embodiment of the shaped cathode shown in FIG. 3d may be altered during treatment. For example, the position of the shaped cathode shown in FIG. 3d may be altered in a lateral direction as represented by arrows 103. The embodiment of the shaped cathode shown in FIG. 3d may be included in a system such as that described above with respect to the embodiment shown in FIG. 3a. Therefore reference is made to that discussion with respect to the system.

Regardless of the embodiment of the shaped cathode and/or system that the shaped cathode is included in, the wafer or substrate may be arranged within about 1 mm to about 3 mm of the shaped cathode. The wafer or substrate may be rotated at a rate of from about 5 to about 30 revolutions per minute. Deionized water as a protective fluid described above may flow at a rate of from about 100 to about 300 ml per minute. Nitrogen ($N_2$) may flow at a rate of from about 500 to about 3000 sccm.

The electrolyte may be directed on the wafer or substrate simultaneously with an application of direct current to the shaped cathode with a current density of from about 20 to about 80 $mA/cm^2$. The current supplied to the shaped cathode and the flow of electrolyte may be pulsed with a desired on/off cycle. In general, the unwanted metal on the wafer or substrate edge and/or backside amy be entirely or substantially entirely removed in less than about 20 seconds.

After removal of the metal, the wafer or substrate may be rotated at a rate of from about 120 to about 300 revolutions per minute for about 5 seconds with a flow of a protective material, such as the deionized water and nitrogen described above. The wafer or substrate may continue to be rotated for about 5 seconds with the protective material flow turned off. The wafer or substrate may then be moved onto a track, which transports it to a wafer cassette in a deionized water treatment.

Any of the above treatment parameters may be varied to achieve a desired removal of metal from a wafer or substrate. One of ordinary skill in the art, once aware of the disclosure contained herein could determine the correct operating parameters without undue experimentation.

The present invention also includes a method for electrochemically deplating metal from side edges and backside of a semiconductor wafer. According to the method, a shaped cathode as described above is placed in the vicinity of a semiconductor wafer. An anode or source of positive voltage is interconnected with a front face of the semiconductor wafer. The position of at least one of the semiconductor wafer and the shaped cathode is altered and current is supplied to the anode and cathode for a time sufficient to substantially completely deplate metal deposited on side edges and backside of the semiconductor wafer.

A method according to the present invention may also be considered to extend further back in time. Accordingly, prior to removal of undesired metal as described above, a seed layer may be deposited on a semiconductor wafer. Then, metal fill of a major surface of the wafer may take place. The shaped cathode of the present invention may then be utilized to remove all metal on the edge and backside of a wafer or workpiece.

Advantages of the present invention include reduced complexity of sputtering tools. Additionally, the present invention reduces particulate production and contamination. The present invention also results in better plating uniformity. Furthermore, the present invention increases chip yields due to the unblocking of portions of a wafer blocked by a clamp ring or a shadow ring. Still further, the present invention can be incorporated into presently used CMP tools, thus having a minimal impact on throughput or cost of ownership.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A device for electrochemically deplating metal from side edges and a backside of a semiconductor wafer, comprising:
    a shaped cathode having a shape substantially corresponding to a shape of at least a portion of the semiconductor wafer, such that the shaped cathode surrounds at least a portion of the backside and at least a portion of the side edge of the semiconductor wafer; and
    means for altering a position of at least one of the semiconductor wafer and the shaped cathode during the electrochemical deplating.

2. The device according to claim 1, wherein the shaped cathode entirely surrounds the backside and side edges of the semiconductor wafer.

3. The device according to claim 1, wherein the position altering means rotates at least one of the semiconductor wafer and the shaped cathode.

4. The device according to claim 3, wherein the position altering means rotates at least one of the semiconductor wafer and the shaped cathode such that the relative speed of the semiconductor wafer and the shaped cathode are about 10 to about 40 revolutions per minute.

5. The device according to claim 1, further comprising:
    at least one edge metal sensor for sensing metal deposited on at least one of the backside and side edges of the semiconductor wafer.

6. The device according to claim 1, wherein the device removes substantially all metal deposited on the backside and side edges of the semiconductor wafer in about 20 seconds or less.

7. The device according to claim 1, wherein the shaped cathode includes a plurality of sections.

8. The device according to claim 7, wherein the shaped cathode sections are discontinuous.

9. The device according to claim 1, wherein the position altering means rotates the semiconductor wafer.

10. The device according to claim 1, wherein the position altering means rotates the shaped cathode.

11. The device according to claim 1, wherein the position altering means rotates the shaped cathode and the semiconductor wafer.

12. The device according to claim 1, wherein the position altering means slides at least one of the semiconductor wafer and the shaped cathode relative to each other.

13. The device according to claim 12, wherein the position altering means slides the shaped cathode laterally with respect to the semiconductor wafer.

14. The device according to claim 12, wherein the position altering means slides the shaped cathode vertically with respect to the semiconductor wafer.

15. The device according to claim 12, wherein the position altering means slides the shaped cathode and the semiconductor wafer.

16. The device according to claim 1, wherein the position altering means slides at least one of the semiconductor wafer and the shaped cathode relative to each other and wherein the position altering means rotates at least one of the semiconductor wafer and the shaped cathode relative to each other.

17. The device according to claim 1, further comprising:
    an anode in contact with a front face of the semiconductor wafer.

18. The device according to claim 17, wherein the position altering means includes means for engaging and altering the position of at least one of the anode and the shaped cathode.

19. A method for electrochemically deplating metal from side edges and a backside of a semiconductor wafer, the method comprising the steps of:
    placing a shaped cathode having a shape substantially corresponding to a shape of at least a portion of the semiconductor wafer, such that the shaped cathode surrounds at least a portion of the backside and side edges of the semiconductor wafer in the vicinity of at least a portion of the backside and side edges of the semiconductor wafer;
    placing an anode in contact with at least a portion of a front side of the semiconductor wafer;
    altering a position of at least one of the semiconductor wafer and the shaped cathode;
    directing an electrolyte between the semiconductor wafer and the shaped cathode; and
    supplying current to the anode and the cathode for a time sufficient to substantially completely deplate metal deposited on the side edges and backside of the semiconductor wafer.

20. The method according to claim 19, wherein the position of the semiconductor wafer and the shaped cathode are altered with respect to each other by at least one of sliding at least one of the semiconductor wafer and the shaped cathode relative to each other and rotating at least one of the semiconductor wafer and the shaped cathode relative to each other.

21. The method according to claim 20, wherein at least one of the shaped cathode and the semiconductor wafer is rotated such that the shaped cathode and the semiconductor wafer rotate relative to each other at a speed of from about 10 to about 40 revolutions per minute.

22. The method according to claim 19, wherein substantially all metal deposited on the backside and side edges of the semiconductor wafer in about 20 seconds or less.

23. The method according to claim 19, wherein current is supplied to the anode and the cathode for a period of time of from about 3 seconds to about 25 seconds at a current of from about 0.1 amperes to about 2 amperes.

24. The method according to claim 19, wherein a mixture of deionized water and nitrogen is sprayed on the wafer to protect unwanted metal during the selective removal of unwanted metal.

25. The method according to claim 19, wherein oxygen is introduced into the electrolyte prior to directing the electrolyte between the semiconductor wafer and the shaped cathode to enhance metal deplating.

26. The method according to claim 19, wherein oxygen and nitrogen are introduced into the electrolyte prior to directing the electrolyte between the semiconductor wafer and the shaped cathode to enhance metal deplating.

27. The method according to claim 19, wherein nitrogen is introduced into the electrolyte prior to directing the electrolyte between the semiconductor wafer and the shaped cathode to enhance metal deplating.

28. A system for deplating undesired metal from a substrate, the system comprising:

a shaped cathode having an upper surface having a contour corresponding to at least a portion of the substrate;

means for altering a position of at least one of the semiconductor wafer and the shaped cathode;

at least one source of at least one material for removing the metal and directing the material between the shaped cathode and the substrate; and a power source for supplying power to the shaped cathode.

* * * * *